United States Patent
Watanabe et al.

(10) Patent No.: US 7,583,948 B2
(45) Date of Patent: Sep. 1, 2009

(54) TIME CONSTANT AUTOMATIC ADJUSTING CIRCUIT, FILTER CIRCUIT SYSTEM, AND METHOD OF AUTOMATICALLY ADJUSTING TIME CONSTANT

(75) Inventors: Osamu Watanabe, Kanagawa (JP); Rui Ito, Kanagawa (JP); Shigehito Saigusa, Kanagawa (JP); Tetsuro Itakura, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 460 days.

(21) Appl. No.: 11/411,939

(22) Filed: Apr. 27, 2006

(65) Prior Publication Data

US 2006/0245132 A1 Nov. 2, 2006

(30) Foreign Application Priority Data

Apr. 28, 2005 (JP) ............................. 2005-132411

(51) Int. Cl.
*H04B 1/00* (2006.01)
(52) U.S. Cl. ..................... 455/307; 455/258; 455/255; 331/108 B; 331/34; 331/137
(58) Field of Classification Search .............. 455/307, 455/422, 425, 456.5, 456.6, 561, 550.1, 575.1, 455/67.16, 306, 150.1, 76, 147, 165.1, 183.1, 455/258, 255, 260; 327/552, 553, 291, 158, 327/532, 375; 331/14, 16, 108 B, 34, 137, 331/11, 12, 36 C, 36 L, 36 R, 35, 25, 17, 331/1 A, 177 R; 375/374, 350, 362; 361/90, 361/240; 333/17.1, 17.2, 17.3
See application file for complete search history.

(56) References Cited

U.S. PATENT DOCUMENTS 4,561,014 A * 12/1985 Douziech et al. ............ 348/507

(Continued)

FOREIGN PATENT DOCUMENTS

JP            03-265217           11/1991

(Continued)

OTHER PUBLICATIONS

Mehrmanesh et al. IEEE 0-7803-7761-3-30, 2003, Title- An Ultra low voltage Gm-C filter for Video Application, pp. I-561-I-564. 1-Sharif Universit. 2-Emad Semicon.*

(Continued)

*Primary Examiner*—Duc Nguyen
*Assistant Examiner*—Charles Chow
(74) *Attorney, Agent, or Firm*—Oblon, Spivak, McClelland, Maier & Neustadt, P.C.

(57) ABSTRACT

A time constant automatic adjusting circuit comprises: a filter circuit varying a phase of an clock signal to be input so as to output the clock signal; a phase comparison circuit comparing a phase of an output signal of the filter circuit with the phase of the clock signal, and outputting a predetermined voltage when the phase of the output signal and the phase of the clock signal are the same; at least three comparators comparing the output voltage with a plurality of different voltages; an up-down counter counting a number of output bits of either one of the at least three different voltages in accordance with an output result of the comparators; and a control circuit varying the time constant of the filter circuit in accordance with the number of output bits counted by the up-down counter.

14 Claims, 16 Drawing Sheets

U.S. PATENT DOCUMENTS

| | | | | |
|---|---|---|---|---|
| 4,890,305 | A * | 12/1989 | Devries | 375/374 |
| 5,247,281 | A * | 9/1993 | Facon et al. | 340/562 |
| 5,493,243 | A * | 2/1996 | Ghoshal | 327/158 |
| 5,745,001 | A * | 4/1998 | Ueshima et al. | 327/553 |
| 5,815,540 | A * | 9/1998 | Aoki | 375/376 |
| 5,936,473 | A * | 8/1999 | Taniguchi et al. | 331/14 |
| 6,911,863 | B2 * | 6/2005 | Kattner et al. | 327/553 |
| 7,123,082 | B2 * | 10/2006 | Kurose et al. | 327/552 |
| 2002/0113586 | A1 * | 8/2002 | Ho et al. | 324/76.29 |
| 2004/0095189 | A1 * | 5/2004 | Rochow | 329/347 |
| 2005/0148309 | A1 * | 7/2005 | Fukusen et al. | 455/150.1 |
| 2005/0168274 | A1 * | 8/2005 | Kimura | 327/552 |
| 2006/0139107 | A1 * | 6/2006 | Ota et al. | 331/16 |
| 2007/0057719 | A1 * | 3/2007 | Kitano | 327/552 |
| 2007/0096789 | A1 * | 5/2007 | Desai et al. | 327/291 |
| 2008/0218255 | A1 * | 9/2008 | Fujiyama et al. | 327/553 |

FOREIGN PATENT DOCUMENTS

| | | |
|---|---|---|
| JP | 04-200115 | 7/1992 |
| JP | 07315437 | * 12/1995 |
| JP | 09-083294 | 3/1997 |
| JP | 2001-068966 | 3/2001 |
| JP | 3335872 | 8/2002 |

OTHER PUBLICATIONS

S. Mehrmanesh, et al., "An Ultra Low-Voltage Gm-C Filter for Video Applications", ISCAS, 2003, pp. I-561-I-564.

* cited by examiner

RESET SIGNAL

TIME CONSTANT AUTOMATIC ADJUSTING CIRCUIT, FILTER CIRCUIT SYSTEM, AND METHOD OF AUTOMATICALLY ADJUSTING TIME CONSTANT

CROSS-REFERENCE TO RELATED APPLICATION

This application is based on and claims the benefit of priority from the prior Japanese Patent Application No. 2005-132411, filed on Apr. 28, 2005; the entire contents of which are incorporated herein by reference.

TECHNICAL FIELD

The present invention relates to a time constant automatic adjusting circuit of a filter circuit and a method thereof, and more particularly, to a time constant automatic adjusting circuit of a filter circuit which is used in an integrated circuit for wireless communication and a method of automatically adjusting a time constant.

BACKGROUND

In receiving and transmitting unit of wireless communication systems, filter circuits are generally used so as to filter signals within a range of bands other than a predetermined signal band. There are various kinds of filter circuits. However, among them, filter circuits whose time constant (cutoff frequency) is determined by multiplication between a resistance value (R) and capacitance value (C) are effective in integration. Therefore, these filter circuits have been used for integration circuits in wireless communication terminals, such as cellular phones or the like.

However, a problem may occur in the filter circuit constructed on the integrated circuit due to the following reason. Since variation occurs in manufacturing elements, a time constant may vary, which results in lowering a manufacture yield. As an example of a method of preventing a manufacture yield from being lowered due to the manufacture variation, as in a method described in "An Ultra Low-Voltage Gm-C Filter for Video Applications", S. Mehrmanesh, et. al., ISCAS2003, I-561-564, a clock is input to a test filter circuit, and a time constant is automatically adjusted such that an amount of shifted phase of a clock in the output of the test filter circuit becomes a predetermined value.

In this method, according to the output results of two comparators, an up-down counter allows its output bit to be upward or downward, repeats the up or down operation until output results of the phase comparison circuit become predetermined values, and adjusts phase variation in the filter circuit, that is, a time constant.

However, in this circuit structure, when the element variation is large, the number of times of the repeated up/down operation increases, which results in an increase of time taken until the adjustment of the phase variation is completed. As a result, an amount of consumed current increases as much as the increase of the time taken until the adjustment of the phase variation is completed. In addition, when the circuit structure is used in a system in which the short adjustment time is required, the manufacture yield may be lowered, which causes a problem.

According to the above-described related art, much adjustment time is required when automatically adjusting a time constant of a filter circuit in an integrated circuit, which results in increasing a power consumed by the integrated circuit or lowering a manufacture yield of the integrated circuit.

SUMMARY

The invention has been made up to solve the above-mentioned problems, and provide a time constant automatic adjusting circuit and a time constant automatic adjusting method.

According to an aspect of the invention, a time constant automatic adjusting circuit can achieve an integrated circuit in which adjustment time is short when a time constant of a filter circuit is automatically adjusted.

According to another aspect of the invention, a time constant automatic adjusting circuit for adjusting a time constant of a filter circuit to which clock signal is input and which outputs filtered signal, the time constant is variable, including: a phase comparison circuit configured to generate output voltage according to a result of comparing a phase of an filtered signal with the phase of the clock signal; a first comparator configured to compare the output voltage with a first predetermined voltage; a second comparator configured to compare the output voltage with a second predetermined voltage, the second predetermined voltage is bigger than the first predetermined voltage; a third comparator configured to compare the output voltage with a third predetermined voltage, the third predetermined voltage is bigger than the second predetermined voltage; an up-down counter configured to generate counted bit signal according to the result of the first comparator, the second comparator, and the third comparator; and a control circuit configured to adjust the time constant of the filter circuit in accordance with the counted bit signal; wherein, the up-down counter adds first value to the counted bit signal when the output voltage is bigger than the first predetermined voltage, the up-down counter adds second value which is smaller than the first value to the counted bit signal when the output voltage is between the first predetermined voltage and the second predetermined voltage, and the up-down counter subtracts third value from the counted bit signal when the output voltage is smaller than the third predetermined voltage.

According to another aspect of the invention, a time constant automatic adjusting circuit comprises: a filter circuit varying a phase of a clock signal to be input so as to output the clock signal; a phase comparison circuit comparing a phase of an output signal of the filter circuit with the phase of the clock signal, and outputting a predetermined voltage when the phase of the output signal of the filter circuit and the phase of the clock signal are the same; at least three comparators comparing the output voltage of the phase comparison circuit with a plurality of different voltages; an up-down counter counting a number of output bits of either one of the at least three different voltages in accordance with an output result of the comparators; a control circuit varying the time constant of the filter circuit in accordance with the number of output bits counted by the up-down counter; and a switch capable of connecting or disconnecting the clock signal to be input to the filter circuit and the clock signal to be output from the filter circuit to the phase comparison circuit.

BRIEF DESCRIPTION OF THE DRAWINGS

These and other objects and advantages of this invention will become more fully apparent from the following detailed description taken with the accompanying drawings in which.

DESCRIPTION OF THE EMBODIMENTS

Hereinafter, Embodiments of the invention will be described with reference to the accompanying drawings.

First Embodiment

Figure 1:
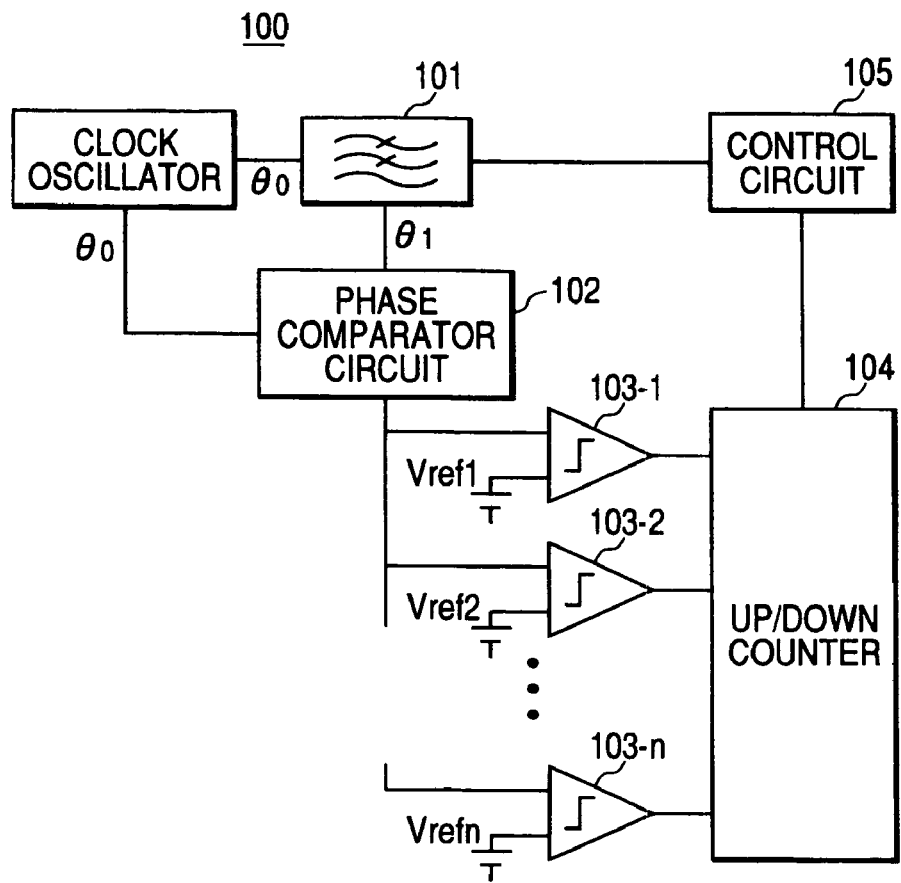
FIG. 1 is a block diagram illustrating a time constant automatic adjusting circuit according to a first embodiment of the invention.

FIG. 1 is a block diagram illustrating a time constant automatic adjusting circuit according to a first embodiment of the invention.

A time constant automatic adjusting circuit 100 includes a filter circuit 101 to which a clock signal is input, a phase comparison circuit 102 that compares a phase of an output signal of the filter circuit 101 with a phase of the clock signal, at least three comparators 103-1, 103-2, ..., and 103-n that use the output of the phase comparison circuit 102 as input thereof, an up-down counter 104 that uses the output of these comparators as input thereof, and a control circuit 105 that controls a time constant of the filter circuit 101 on the basis of the output of the up-down counter 104. The phase comparison circuit 102, the comparators 103-1, 103-2, ..., and 103-n, the up-down counter 104, and the control circuit 105 form an automatic adjusting loop of a time constant of the filter circuit 101.

Figure 13:
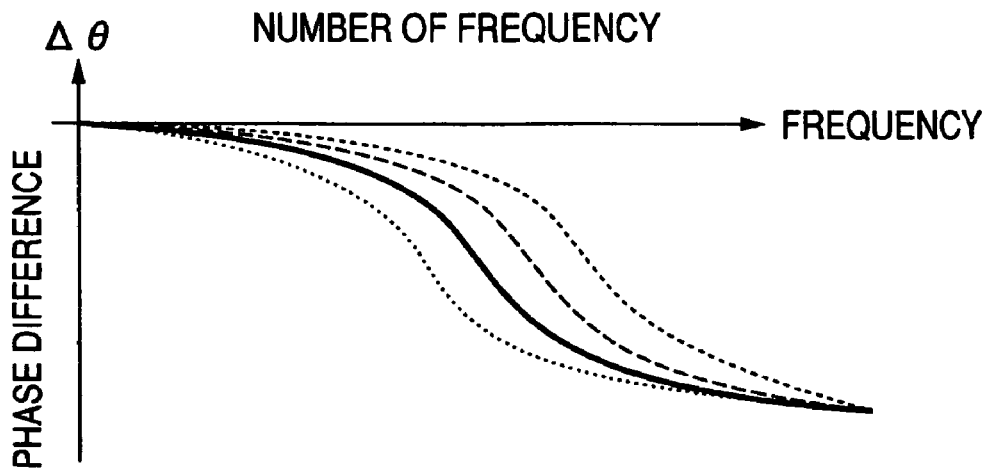
FIG. 13 is a diagram illustrating an example of a frequency characteristic of a time constant variable filter that is used in the time constant control unit according to the first embodiment.

FIG. 13 is a diagram illustrating an example of a frequency characteristic of a phase difference (Δθ) between a phase (Δ0) of an input signal and a phase (θ1) of an output signal in the filter circuit 101. The filter circuit 101 allows the frequency characteristic of the phase difference (Δθ) between the phase (θ0) of the input signal and the phase (θ1) of the output signal to be varied to the characteristic illustrated by curved lines, such as a solid line and broken lines of FIG. 13, in accordance with a control signal. That is, the filter circuit corresponds to a filter circuit whose time constant is varied in accordance with the control signal. In FIG. 13, a horizontal axis indicates a frequency and a longitudinal axis indicates a phase difference.

Figure 14:
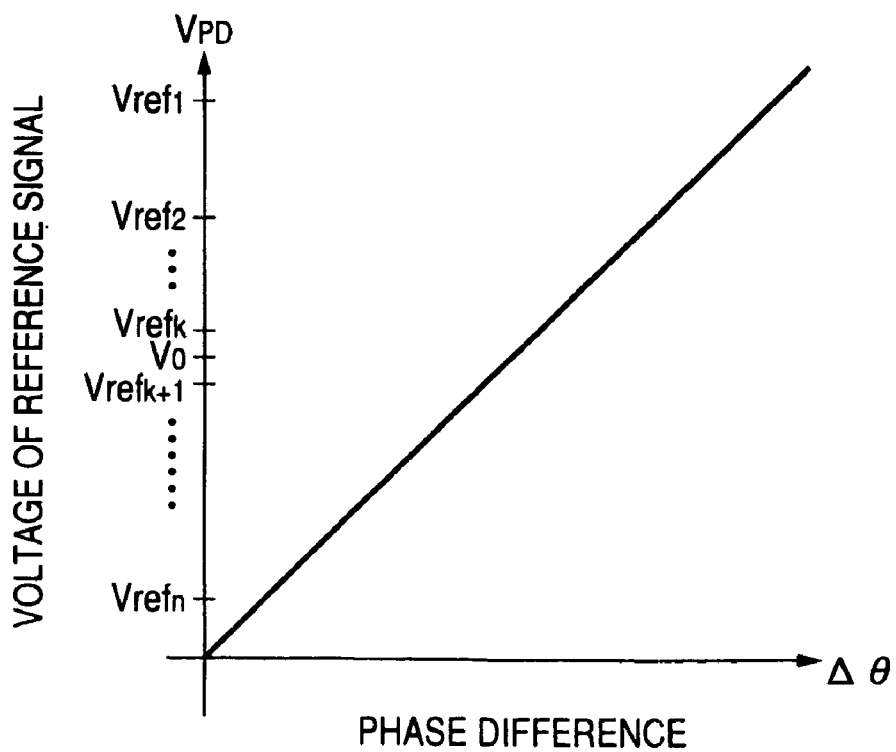
FIG. 14 is a diagram illustrating an example of an input/output characteristic of a phase comparison circuit that is used in the time constant control unit according to the first embodiment of the invention.

The clock, which is input to the filter circuit 101, is output in a state in which a phase of the clock is varied in accordance with the time constant of the filer circuit 101 and a frequency of the clock at the time of the output from the filter circuit 101. For example, as shown in FIG. 14, the phase comparison circuit 102 outputs a signal (VPD) according to a phase difference (Δθ) between a signal output from the filter circuit 101 and the clock input to the filter circuit 101.

The signals output from the phase comparison circuit 102 are compared with at least three reference signals Vref1, Vref2, ..., and Vrefn in the at least three comparators 103-1, 103-2, ..., and 103-n. The output from each comparator is input to the up-down counter 104, and an output bit of the up-down counter is counted upward or downward in accordance with the output result of each comparator. As shown in FIG. 14, voltages of reference signals of the respective comparators 103-1, ..., 103-k, 103-k+1, ..., and 103-n are set in accordance with the condition Vref1> . . . > Vrefk>V0>Vrefk+1> . . . >Vrefn, and the k-th reference signal Vrefk and (k+1)-th reference signal Vrefk +1 are set within a range of 1 LSB from a predetermined value V0 output from the phase comparison circuit 102.

Figure 2:
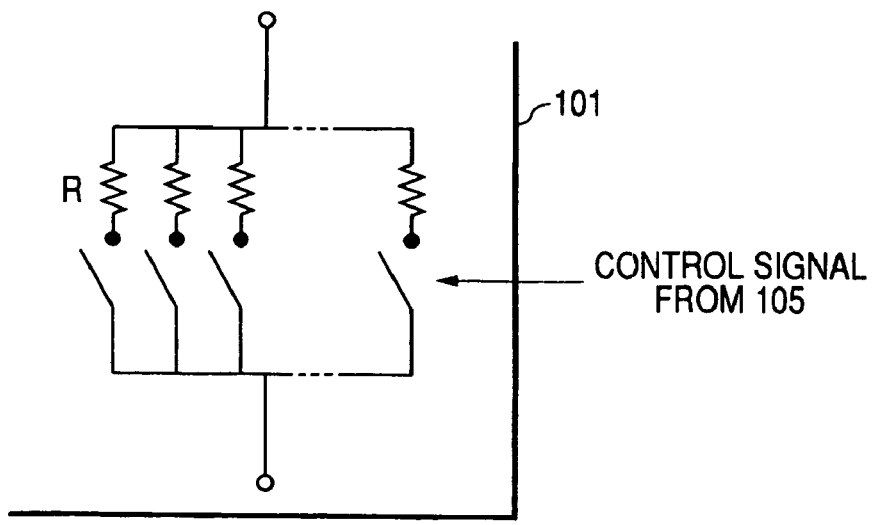
FIG. 2 is a diagram illustrating an example of a time constant control unit according to the first embodiment.
Figure 3:
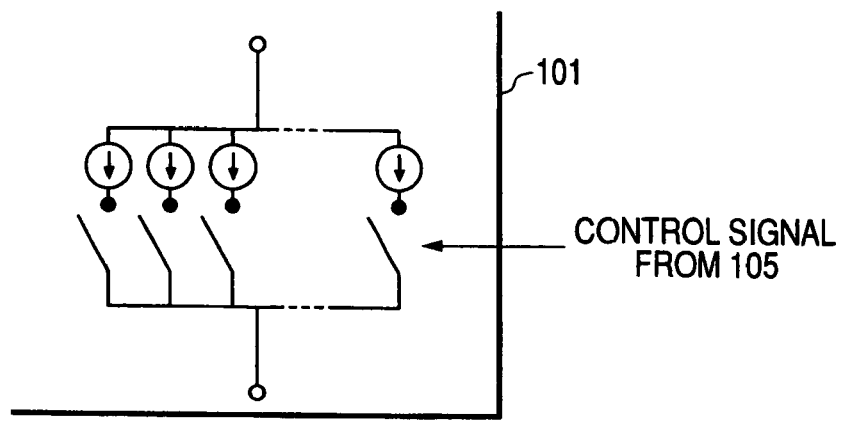
FIG. 3 is a diagram illustrating an example of a time constant control unit according to the first embodiment.

The control circuit 105 controls a time constant of the filter circuit 101 in accordance with the output bit of the up-down counter 104. As a specific example of a method of controlling the time constant of the filter circuit 101, in the filter circuit 101 where a time constant is determined in accordance with a resistance value or a current value, a circuit, such as a variable resistor network shown in FIG. 2 or a variable current source shown in FIG. 3, may be provided, and in the control unit, the output bit of the up-down counter 104 may be converted into a signal for controlling switches in FIG. 2 or 3.

The time constant is controlled such that the output of the phase comparison circuit 102 becomes approximately a predetermined value V0. For example, if the output value of the phase comparison circuit 102 is ½ LSB greater than V0, the time constant is controlled such that the output of the phase comparison circuit 102 becomes smaller. In contrast, if the output value of the phase comparison circuit 102 is ½ LSB smaller than V0, the time constant is controlled such that the output of the phase comparison circuit 102 becomes greater. By constructing this loop, with respect to the time constant of the filter circuit 101, the above-mentioned control operation is repeated until the output of the phase comparison circuit 102 falls within a predetermined range which becomes approximately a predetermined value V0. Finally, the time constant of the filter circuit 101 is controlled such that it becomes approximately a predetermined time constant.

In this case, with respect to the output results from the at least three comparators 103-1 to 103-n, the count number of the output bits of the up-down counter 104 is set to at least three kinds, and the count number of the up-down counter is set in accordance with the output result of the phase comparison circuit 102, that is, the variation in a desired value of the time constant of the filter circuit 101. Specifically, when the variation in the desired value of the time constant is large, an absolute value of the count number is made to be large. As a result, even though the time constant of the filter circuit 101 varies from a desired value by a large value, the time constant can be automatically adjusted in the short time.

Second Embodiment

Figure 4:
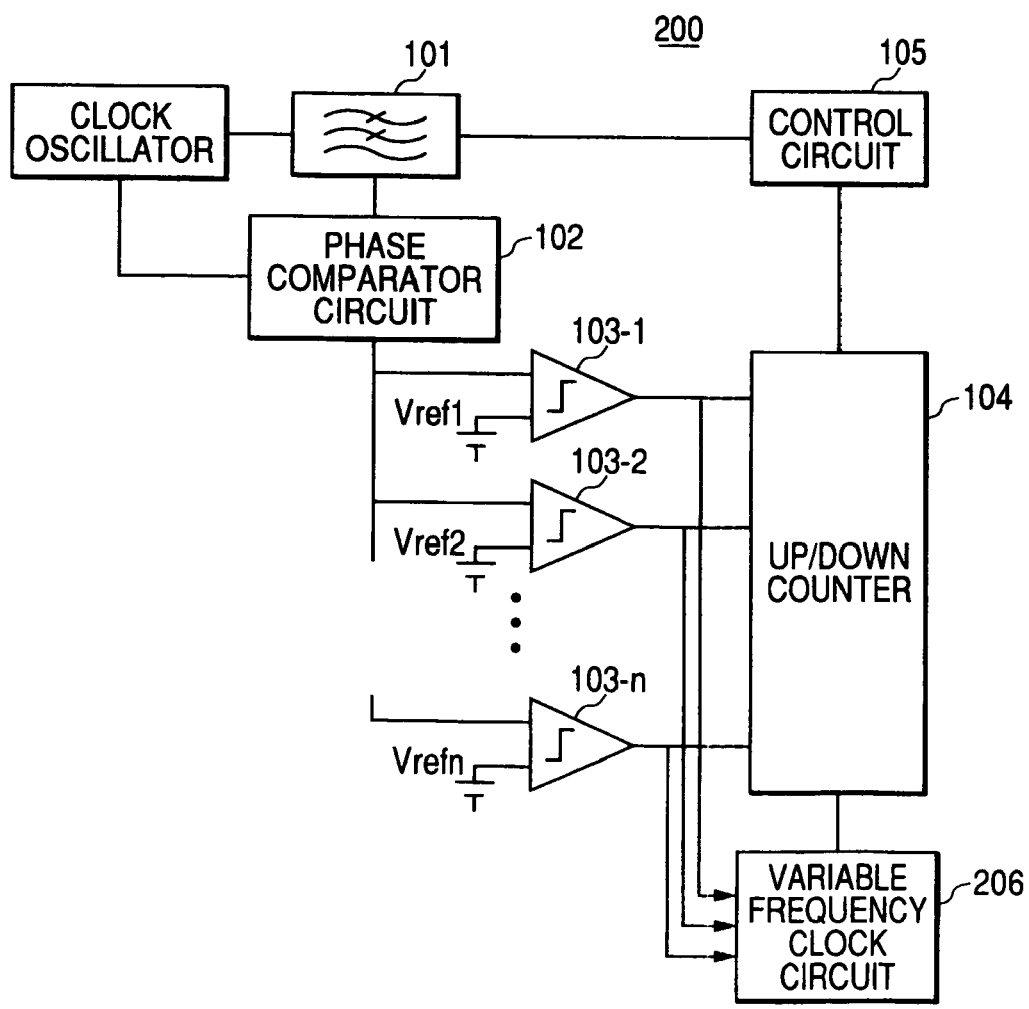
FIG. 4 is a block diagram illustrating a time constant automatic adjusting circuit according to a second embodiment of the invention.

FIG. 4 is a block diagram illustrating a time constant automatic adjusting circuit according to a second embodiment of the invention.

The time constant automatic adjusting circuit 200 includes a filter circuit 101 to which a clock signal is input, a phase comparison circuit 102 that compares an output phase of the filter circuit 101 with a phase of the clock signal, at least three comparators 103-1, 103-2, . . . , and 103-n that use the output of the phase comparison circuit 102 as the input thereof, an up-down counter 104 that uses the output of the comparators as the input thereof, a control circuit 105 that controls a time constant of the filter circuit 101 on the basis of the output of the up-down counter 104, and a frequency variable clock circuit 206 for up-down counter. The time constant automatic adjusting circuit 200 according to the second embodiment is different from the time constant automatic adjusting circuit 100 according to the first embodiment in that the frequency variable clock circuit 206 for up-down counter is provided.

To the frequency variable clock circuit 206, the output of the comparators 103-1, 103-2, . . . , and 103-n is supplied. Therefore, the frequency variable clock circuit 206 has a function of varying a clock frequency that instructs operation timing of the up-down counter 104 in accordance with the output of these comparators.

Specifically, if an output voltage of the phase comparison circuit 102 deviates from a desired value V0, the frequency variable clock circuit 206 outputs a high clock frequency. That is, if the output of the comparator in which a voltage much deviating from the predetermined value V0 is used as a reference signal is supplied, the frequency variable clock circuit 206 outputs a high clock frequency. When the output result from the phase comparison circuit 102 finally much deviates from the predetermined value V0, an output clock frequency of the frequency variable clock circuit 206, which is supplied to the up-down counter 104, increases. As a result, the operation timing of the up-down counter 104 becomes faster, and the output of the phase comparison circuit 102 can be varied to a predetermined value V0 in the short time.

Therefore, according to the second embodiment, it is possible to reduce time necessary for time constant automatic adjustment.

Third Embodiment

Figure 5:
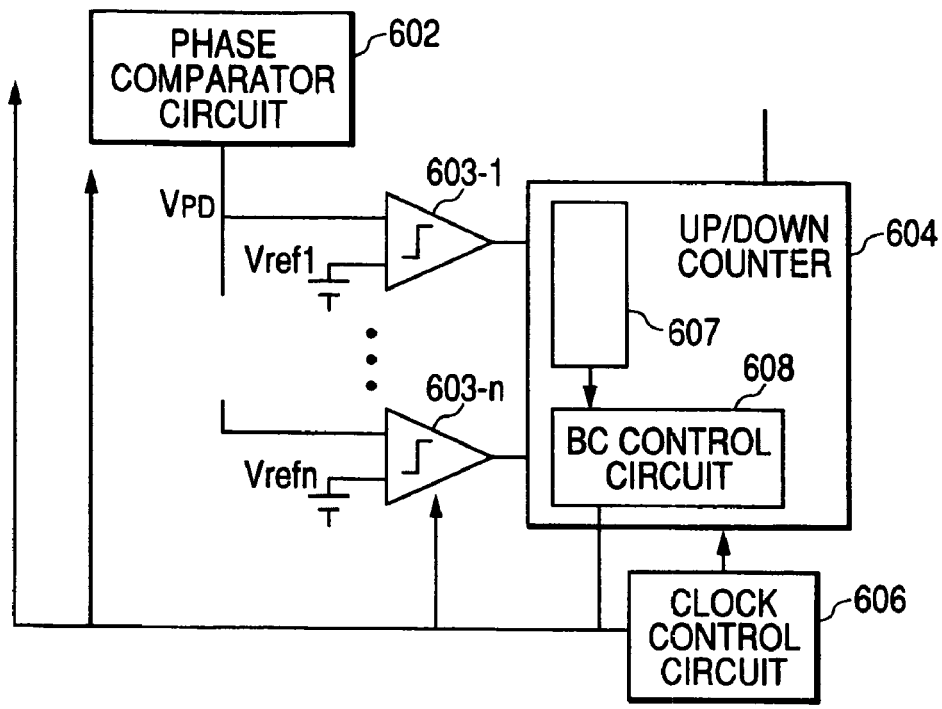
FIG. 5 is a block diagram illustrating a portion of a time constant automatic adjusting circuit according to a third embodiment of the invention.

FIG. 5 is a block diagram illustrating a time constant automatic adjusting circuit according to a third embodiment of the invention. In the time constant automatic adjusting circuit shown in FIG. 5, the up-down counter 604 includes a zero-count number counting circuit 607 and a BS control circuit 608. The zero-count number counting circuit 607 counts how many times the count number becomes 0. In addition, when the zero-count number counting circuit 607 counts the predetermined zero-count number, the BS control circuit 608 stops the supply of the clock with respect to the up-down counter 604, and stops circuits other than the control unit.

As described in the third embodiment, when the output of the phase comparison circuit 602 is a predetermined value (for example, a value between Vrefk and Vrefk+1 in the third embodiment), the counter number set in the up-down counter becomes 0, and the number of times the 0-count is set is calculated in the zero-count number counting circuit 607.

As described in the above-mentioned third embodiment, when the count number becomes 0, the output of the phase comparison circuit 602 corresponds to a predetermined value within a range of 1 LSB. Therefore, it is determined that automatic adjustment is completed when the number of times the count number is 0 exceeds a predetermined number of times, for example, the number of times until the output of the phase comparison circuit 602 is sufficiently stabilized. In addition, the supply of the clock with respect to the up-down counter is stopped and the output bit thereof is held, and the circuits other than the control unit are stopped.

According to the above-mentioned third embodiment, in an integrated circuit in which the element variation is small and an adjustment amount is small, the automatic adjustment time can be reduced, and the power consumption can be further reduced.

Fourth Embodiment

Figure 6:
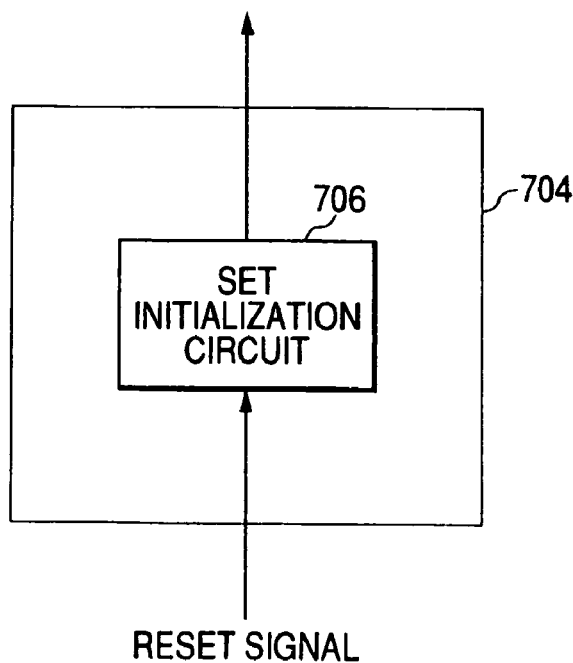
FIG. 6 is a block diagram illustrating an up-down counter having a reset function according to a fourth embodiment of the invention.

FIG. 6 is a block diagram illustrating a portion of a time constant automatic adjusting circuit according to a fourth embodiment of the invention. In FIG. 6, the up-down counter 704 according to the fourth embodiment further has a bit initialization circuit 706. The up-down counter 704 is supplied with a reset signal when automatic adjustment starts. As a result, the output bit thereof is initialized to a predetermined value.

Generally, the element variation is regularly distributed, and 60% or more is distributed in values approximate to a design central value ($\pm\sigma$). Accordingly, when the automatic adjustment starts, the output bit of the up-down counter does not enter an unstable state. For example, when the element variation is not generated, it is set to a bit in which a predetermined time constant is obtained, so that an initialization state and a completed state are set to values approximate to a predetermined value in a high probability. According to the fourth embodiment, it is possible to obtain a time constant automatic adjusting circuit in which time necessary for automatic adjustment can be reduced.

Fifth Embodiment

Figure 7:
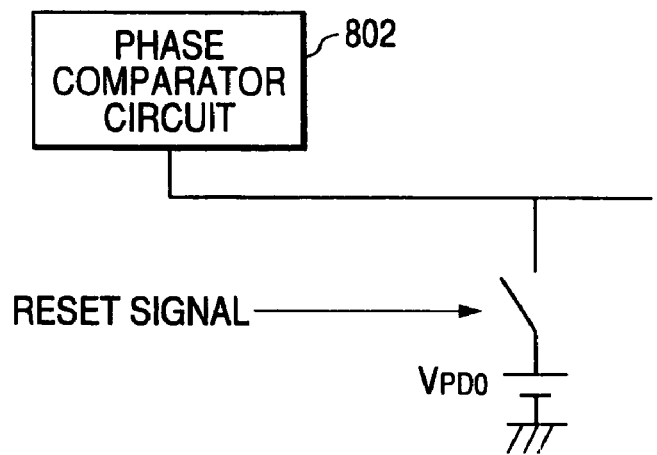
FIG. 7 is a block diagram illustrating a reset function of a phase comparison circuit according to a fifth embodiment of the invention.

FIG. 7 is a block diagram illustrating a portion of a time constant automatic adjusting circuit according to a fifth embodiment of the invention. In the fifth embodiment, as shown in FIG. 7, the output of an output unit of a phase comparison circuit 802 is set to a predetermined value by a reset signal that is input when the automatic adjustment starts.

Similar to the fourth embodiment, in the fifth embodiment, the output of the phase comparison circuit is also set to a predetermined value V0 when the automatic adjustment starts, so that an initialization state and a completed state are set to values approximate to a predetermined value in a high probability. Therefore, time necessary for automatic adjustment can be reduced.

Sixth Embodiment

Figure 8:
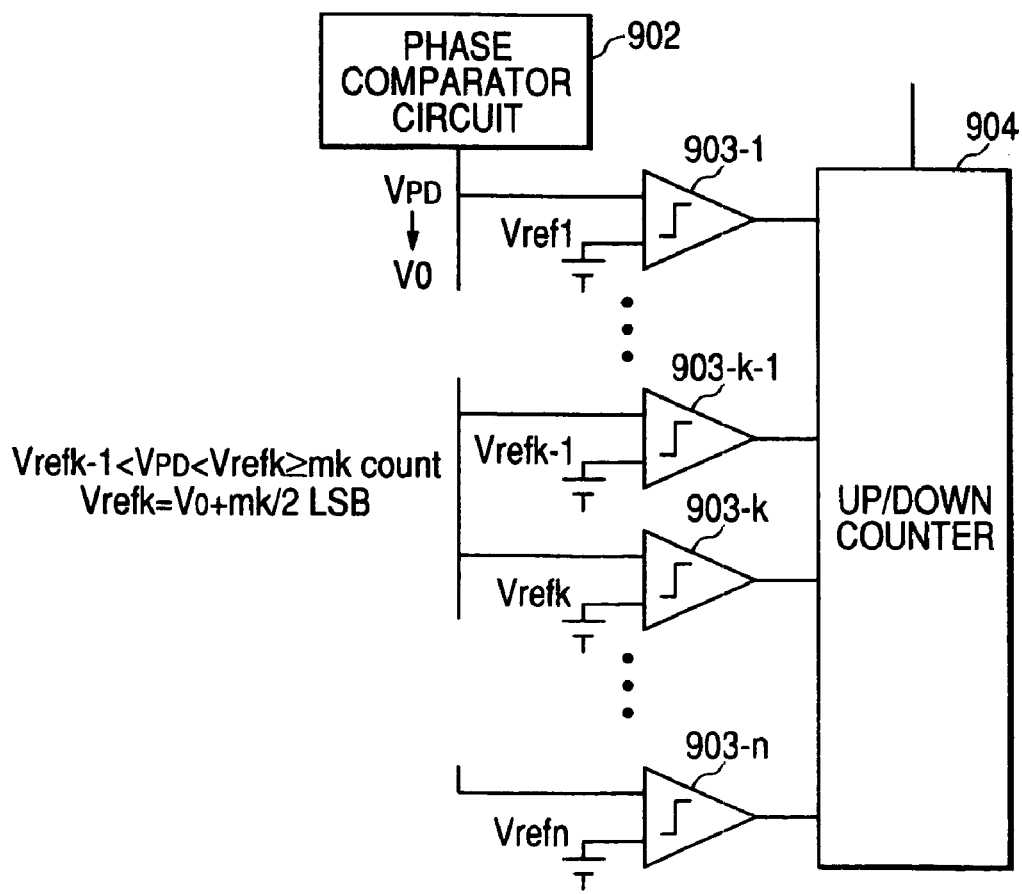
FIG. 8 is a block diagram illustrating a portion of a time constant automatic adjusting circuit according to a sixth embodiment of the invention.

FIG. 8 is a block diagram illustrating a portion of a time constant automatic adjusting circuit according to a sixth embodiment of the invention. In FIG. 8, each of values of reference signals, which are compared in the respective comparators 903-1, ..., and 903-n, is set to a value that deviates from a predetermined output level of the phase comparison circuit by m/2 LSB with respect to the count number m set in the up-down counter. That is, in case the output of the phase comparison circuit is VPD, the condition Vrefk=V0+mk/2 LSB is set in a case in which mk count of the up-down counter is set with respect to the two reference signals Vrefk-1 and Vrefk in accordance with the condition Vrefk-1>VPD>Vrefk. In this case, reference numeral V0 indicates a predetermined value of the phase comparison circuit 902.

Figure 9:
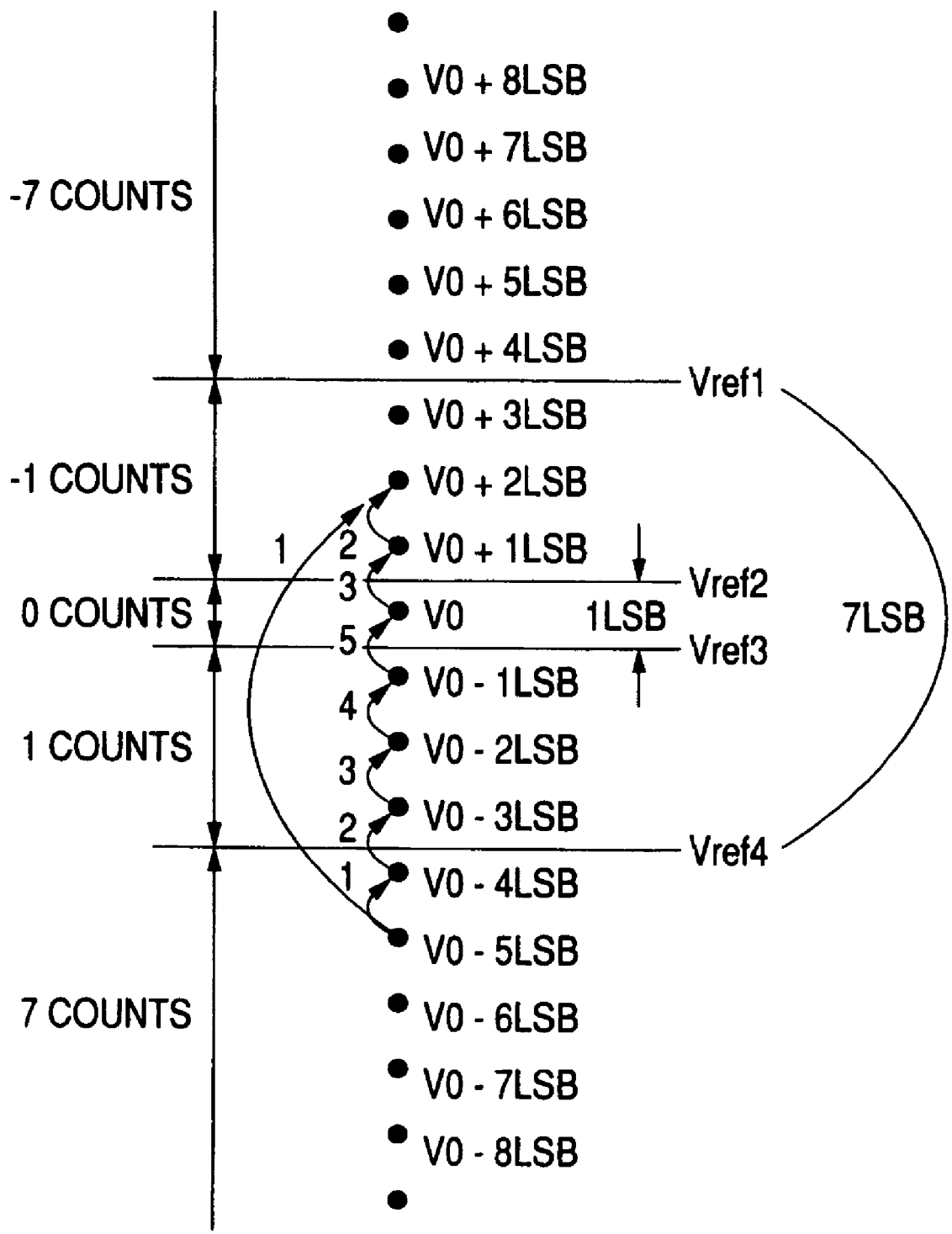
FIG. 9 is a diagram illustrating the automatic adjusting operation according to the sixth embodiment.

FIG. 9 is a diagram illustrating an example of a control flow in a case in which the number of reference signals is set to four of Vref1 to Vref4, and the count-up number of the output bit number of the up-down counter, which corresponds to five intervals of the reference signals, are set to five kinds of −7, −1, 0, 1, and 7. In FIG. 9, the reference signals Vref1 to Vref4 are in accordance with the relationship of Vref1>Vref2>Vref3 >Vref4, and they are set to values that deviate from a predetermined value V0 by ±$^{7}/_{2}$ LSB, ±½ LSB, and %½ LSB (not shown), respectively. That is, if it is the count-up number of the reference signals corresponding to values deviating from the predetermined value V0, a value thereof is set to be large.

In this case, if focusing on a case in which the output of the phase comparison circuit corresponding to V0 −5 LSB in FIG. 9 is adjusted to a predetermined value V0, in the present embodiment, it reaches a predetermined value V0 by performing adjustment three times, as shown by an arrow in FIG. 9.

In addition, in a case in which the Vref4 deviates more from the predetermined value V0 than from a value V0 −5 LSB, if the count-up number is uniformly set to 1, it should be moved from the point V0−5 LSB one count by one count. As a result, the adjustment as much as five times is necessary until it reaches the predetermined value V0, as shown by an arrow in FIG. 9. Therefore, the adjustment time may be further required than in the present embodiment.

In the same manner, in the adjustment from the point deviating from the predetermined value V0 by V0−5 LSB or more to the predetermined value V0, the adjustment time is shorter in a case in which first, it becomes closer to the predetermined value V0 by seven counts by seven counts than in a case in which it becomes closer to the predetermined value V0 from the corresponding point one count by one count. In a case in which the adjustment is made from the V0−4 LSB, the adjustment is made by the same number of times when it moves−1 count by−1 count after it first moves from the corresponding point by seven counts and when it moves 1 count by 1 count from the corresponding point. In the meantime, if each of the Vref1 and Vref4 is set to a position closer location closer than V0±$^{7}/_{2}$ LSB from the predetermined value V0, the region moving by ±1 count becomes less than 7 LSB. Therefore, the movement by ±7 counts may be repeated outside the region moving by ±1 count.

As described above, in the sixth embodiment, it is possible to achieve the automatic adjustment circuit having short adjustment time by setting the reference signal of the comparator. In this case, the value of the reference signal does not need to be strictly m/2 LSB, and may deviate from m/2 LSB by a method of creating a reference signal or the required adjustment precision.

Seventh Embodiment

Figure 16:
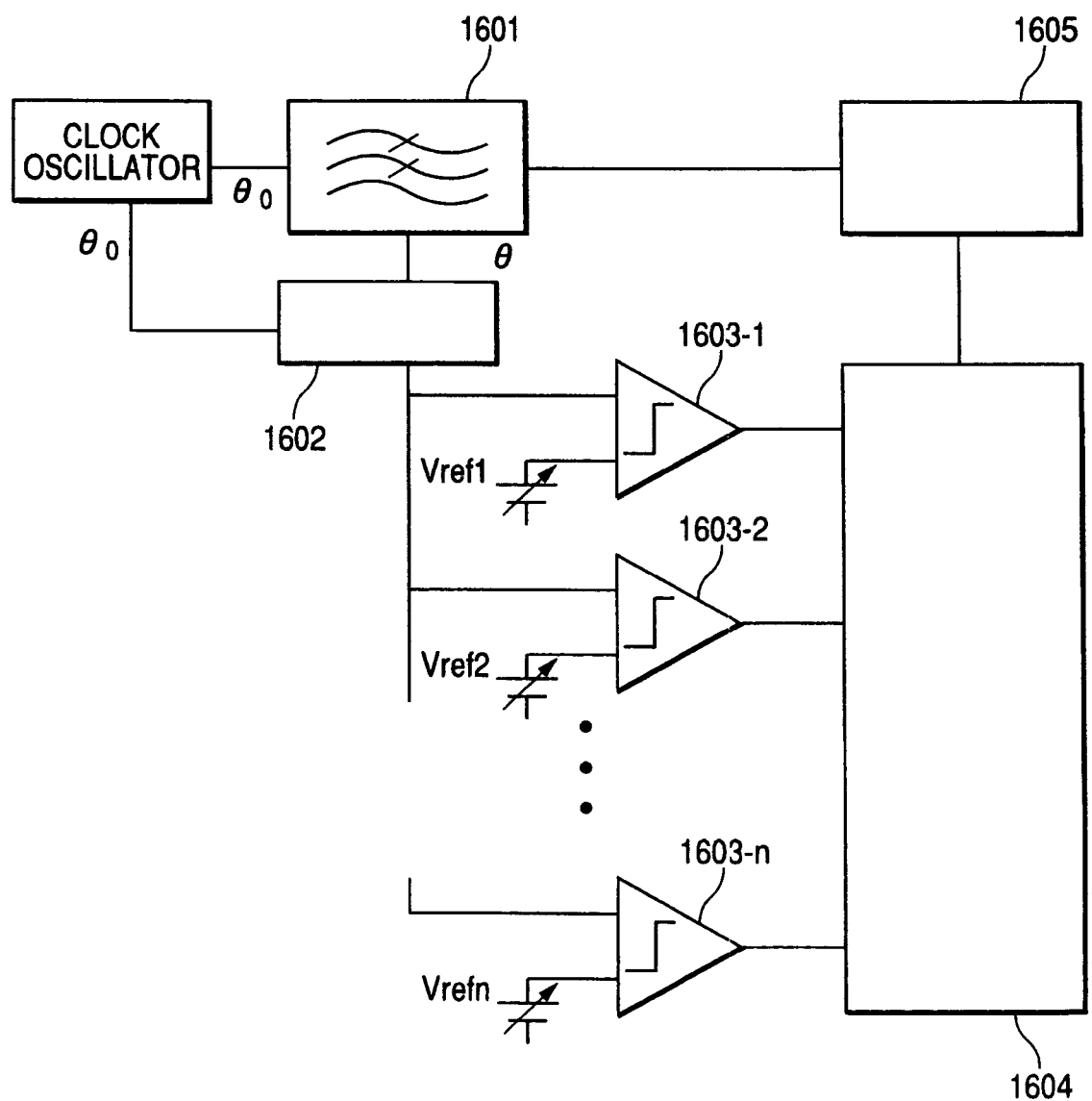
FIG. 16 is a block diagram illustrating a time constant automatic adjusting circuit according to a seventh embodiment of the invention.

FIG. 16 is a block diagram illustrating a time constant automatic adjusting circuit according to a seventh embodiment of the invention. In the time constant automatic adjusting circuit 1600 shown in FIG. 16, voltages of reference signals Vref1, Vref2, ..., and Vrefn, which is compared with the output of the phase comparison circuit 1602, are variable. Therefore, the time constant can be adjusted as a value suitable for various kinds of systems, even if after manufacturing.

Figure 17:
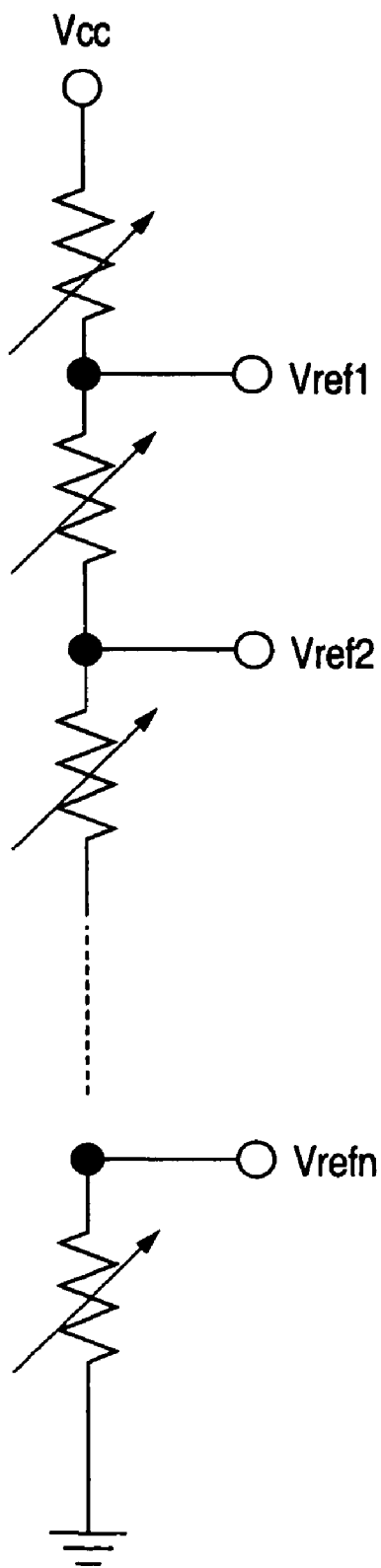
FIG. 17 is a diagram illustrating a variable reference voltage circuit according to a seventh embodiment.

FIG. 17 is a diagram illustrating a variable reference voltage circuit according to the present embodiment. The circuit includes variable registers connected in series. Those variable registers may be elements which resistance can be change continuously. Those variable registers may have fixed resistances and switches.

For example, if an error of the time constant of the filter circuit on a product is big, a difference between maximum value and minimum value of voltages of reference signals should be expanded.

Other example, if same voltage is added to or subtracted from the voltages of all reference signals, the same time constant is obtained at different frequency of clock signal.

Eighth Embodiment

Figure 18:
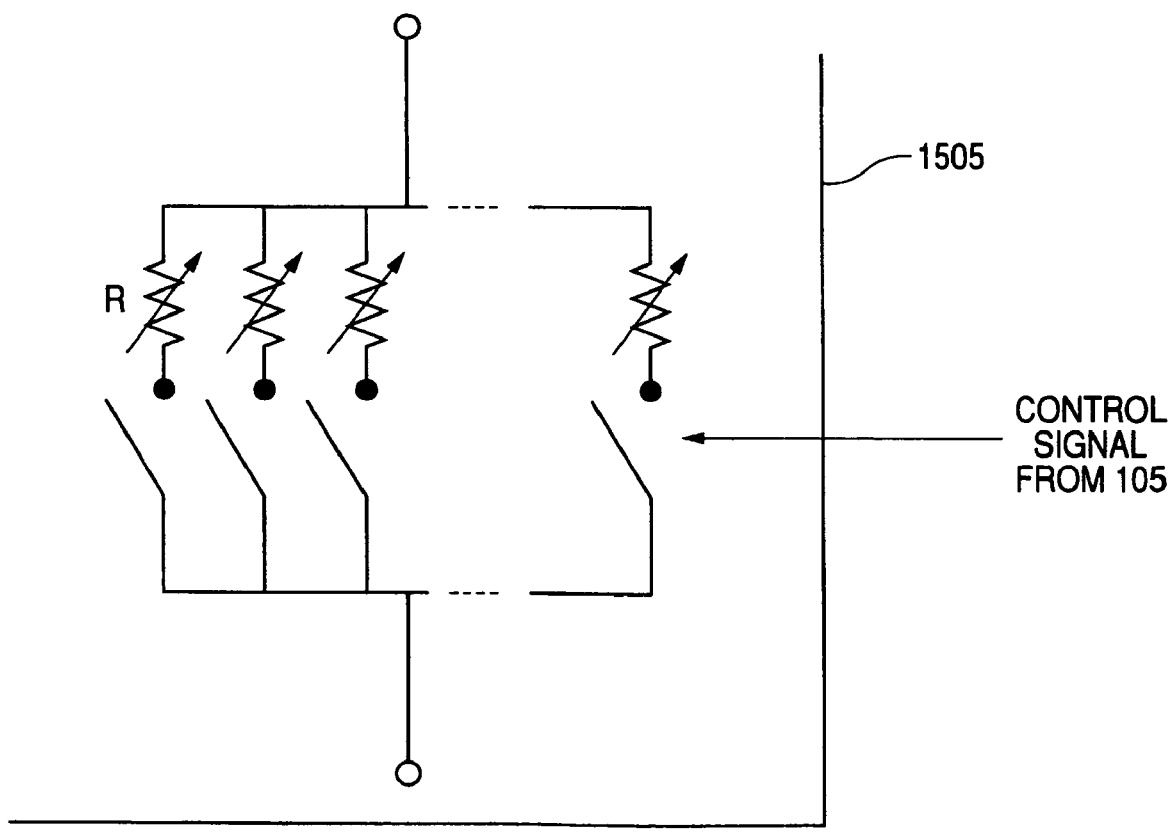
FIG. 18 is a diagram illustrating a control circuit according to the eighth embodiment.

FIG. 18 is a diagram illustrating a control circuit 1505 according to the eighth embodiment of the invention. The control circuit 1505 may be in place of the control circuit 105 of the FIG. 1. In the control circuit 1505, variable registers are connected in parallel and each of registers is connected with switches serially, respectively. The switches are controlled by the output signal of the up-down counter 104. Each of switches is associated with each bit of the output signal of the up-down counter 104.

Differences or ratios between the voltages of reference signals may be determined according to the frequency of the clock signal and class of the wireless communication system.

In case, (1) θ1 is defined as a phase difference between clock signal fclk1 and the output signal of the filter 101, (2) θ2 is defined a phase difference between clock signal fclk2 and the output signal of the filter 101, and the time constant of the filter circuit 101 should be set as same value at the time of (1) and (2), an example of a setting method of the time constant is described below.

Figure 19:
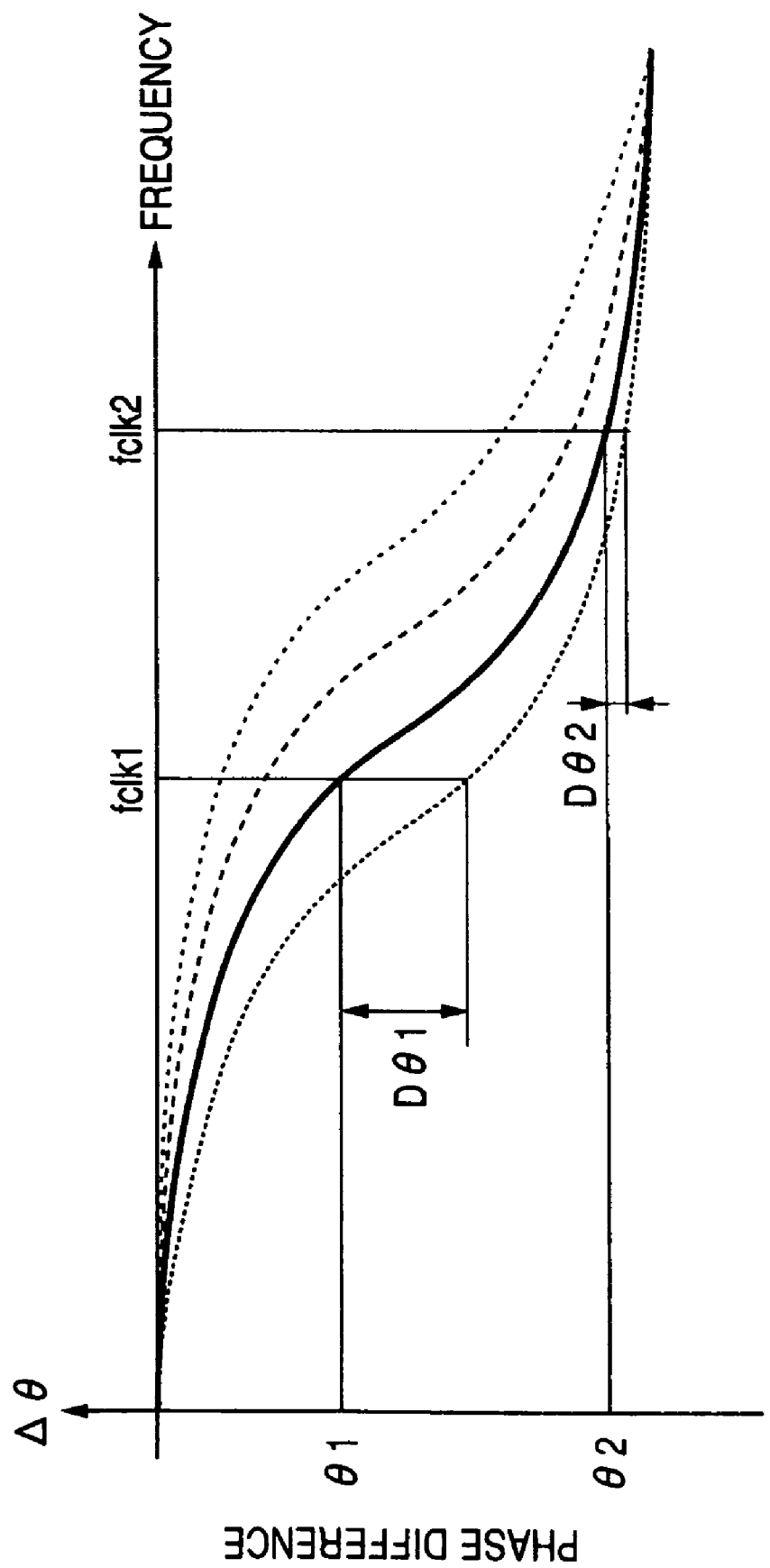
FIG. 19 is a diagram illustrating an example of a frequency characteristic of a time constant variable filter that is used in the time constant control unit according to an eighth embodiment.

FIG. 19 is a diagram illustrating an example of a frequency characteristic of a time constant variable filter that is used in the time constant control unit according to the eighth embodiment. In FIG. 19, frequency response of the filter circuit 101 is drawn with a solid curving line, broken curving line, and dot curbing line. The solid curving line represents the frequency response of the filter circuit 101 of present state. The frequency response transits to the dot curving line, which is on the left side of the solid curving line, if the output bit of up-down counter 104 is incremented.

Dθ1 which is a phase difference between the solid curving line and the dot curving line at the frequency fclk1 is different from Dθ2 which is a phase difference at the fclk2. Then, the differences between the voltages of reference signals at fclk1 may be set broader than the differences at fclk2. The shift variation of the curving line per 1 bit on the phase direction at fclk1 may be set narrower than at fclk2.

Ninth Embodiment

Figure 20:
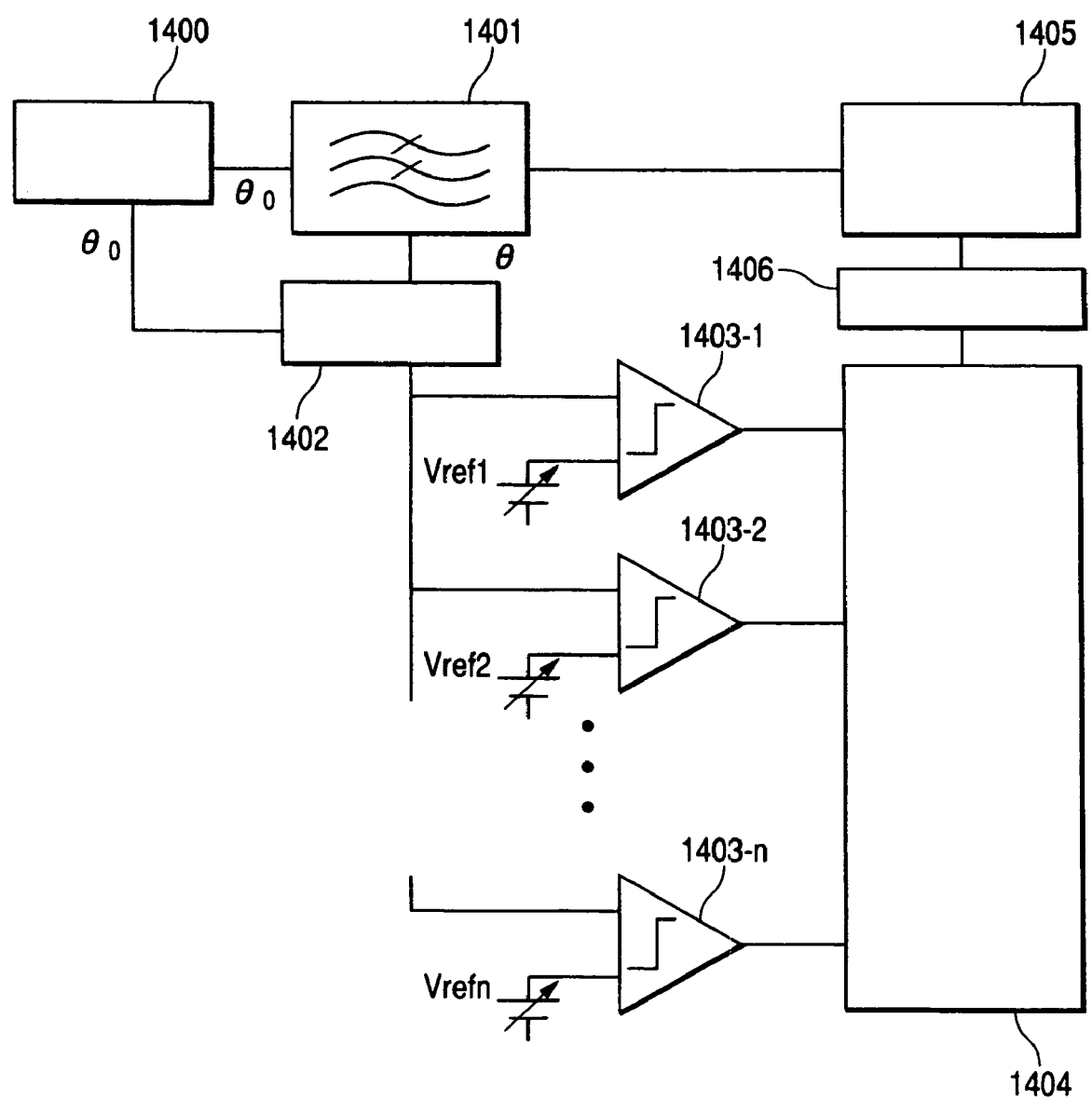
FIG. 20 is a block diagram illustrating a time constant automatic adjusting circuit according to a ninth embodiment.

FIG. 20 is a block diagram illustrating a time constant automatic adjusting circuit according to a ninth embodiment of the invention, which has an adder-subtractor 1406.

The output of the up-down counter 1404 is input to the adder-subtracter 1406. The adder-subtracter 1406 adds or subtracts n bits to or from the value of the output of the up-down counter 1404, the n is some predetermined value. The n may be determined according to the frequency of the clock signal, like the method described in the eighth embodiment.

Figure 21:
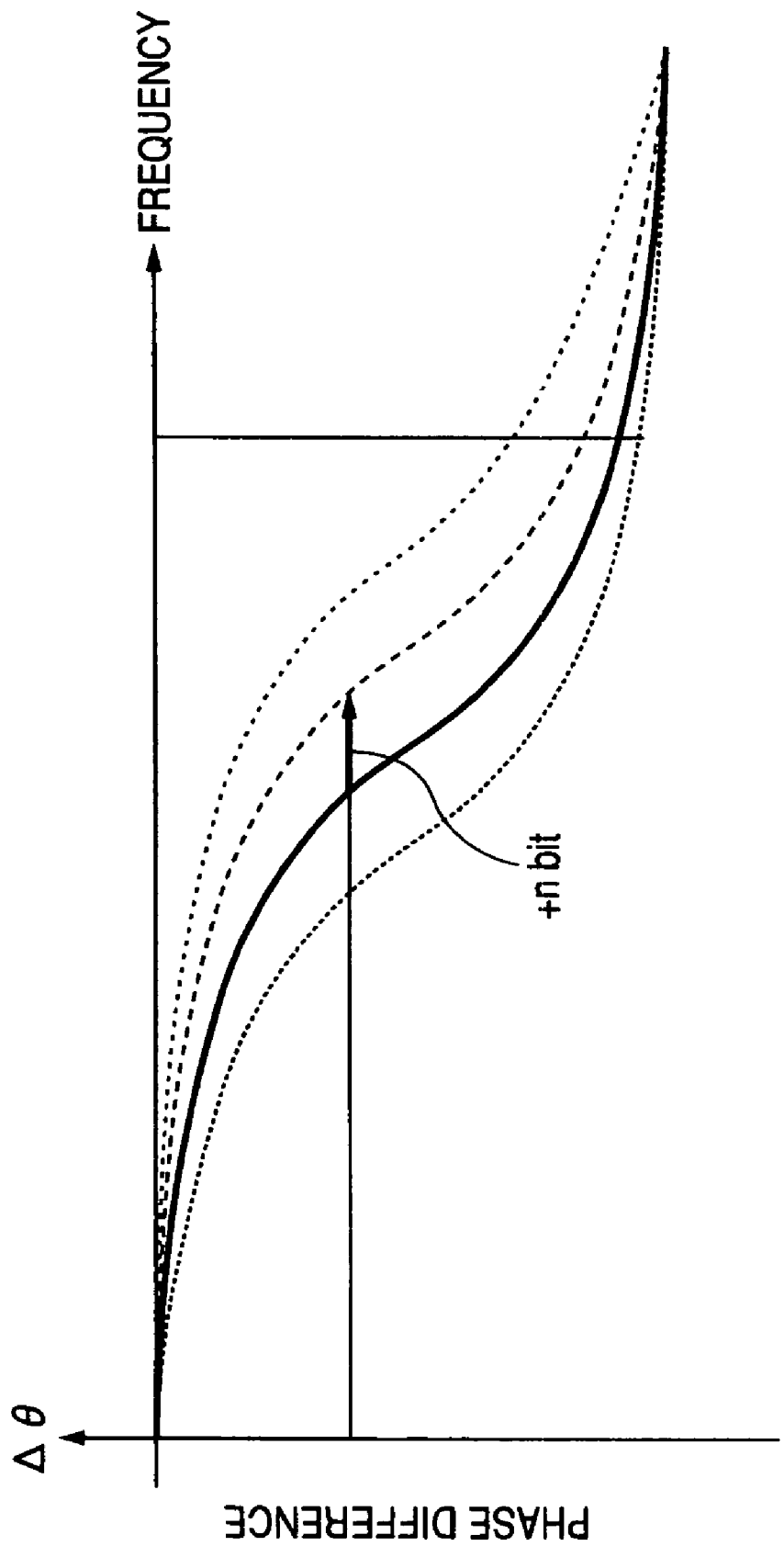
FIG. 21 is a diagram illustrating an example of a frequency characteristic of a time constant variable filter that is used in the time constant control unit according to a ninth embodiment.

FIG. 21 is a diagram illustrating an example of a frequency characteristic of a time constant variable filter that is used in the time constant control unit according to the present embodiment.

Tenth Embodiment

Figure 10:
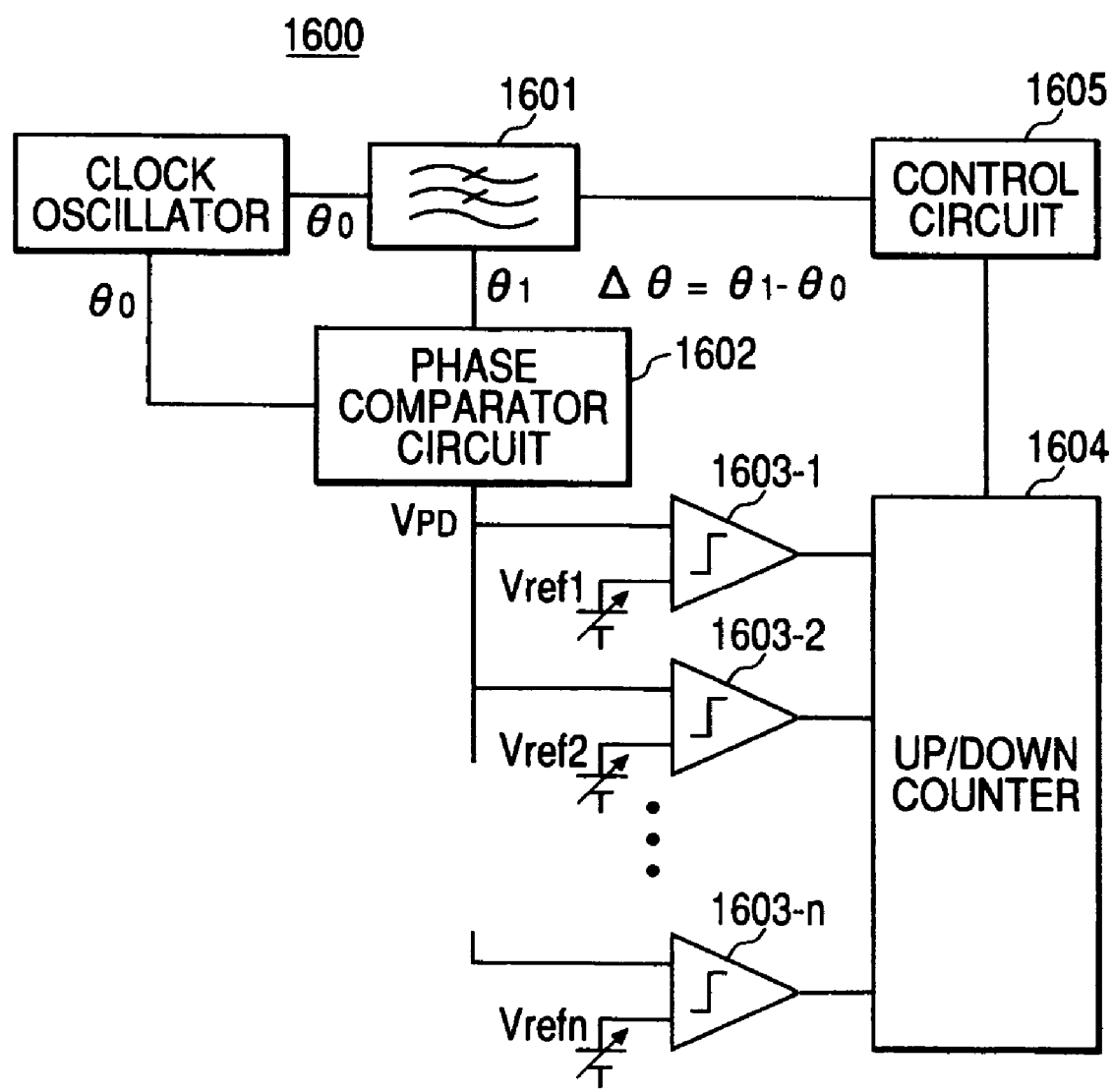
FIG. 10 is a block diagram illustrating a time constant automatic adjusting circuit according to a tenth embodiment of the invention.

FIG. 10 is a block diagram illustrating a time constant automatic adjusting circuit according to a tenth embodiment of the invention. In the time constant automatic adjusting circuit 1000 shown in FIG. 10, reference signal voltages Vref1, Vref2, . . . , and Vrefn, which are compared in the comparators 1603-1, 1603-2, . . . , and 1603-n, are variable. In systems having different bandwidths, a time constant, which is required for a filter used in each system, is different. However, in the time constant automatic adjustment circuit 1600 according to the present embodiment, the reference signal voltage is adjusted, which results in adjusting the time constant that corresponds to each system. In addition, in the different clock frequency, when wanting to obtain the same time constant, the reference signal voltage is adjusted in accordance with the clock frequency, and thus the same automatic adjustment result can be obtained.

Eleventh Embodiment

Figure 11:
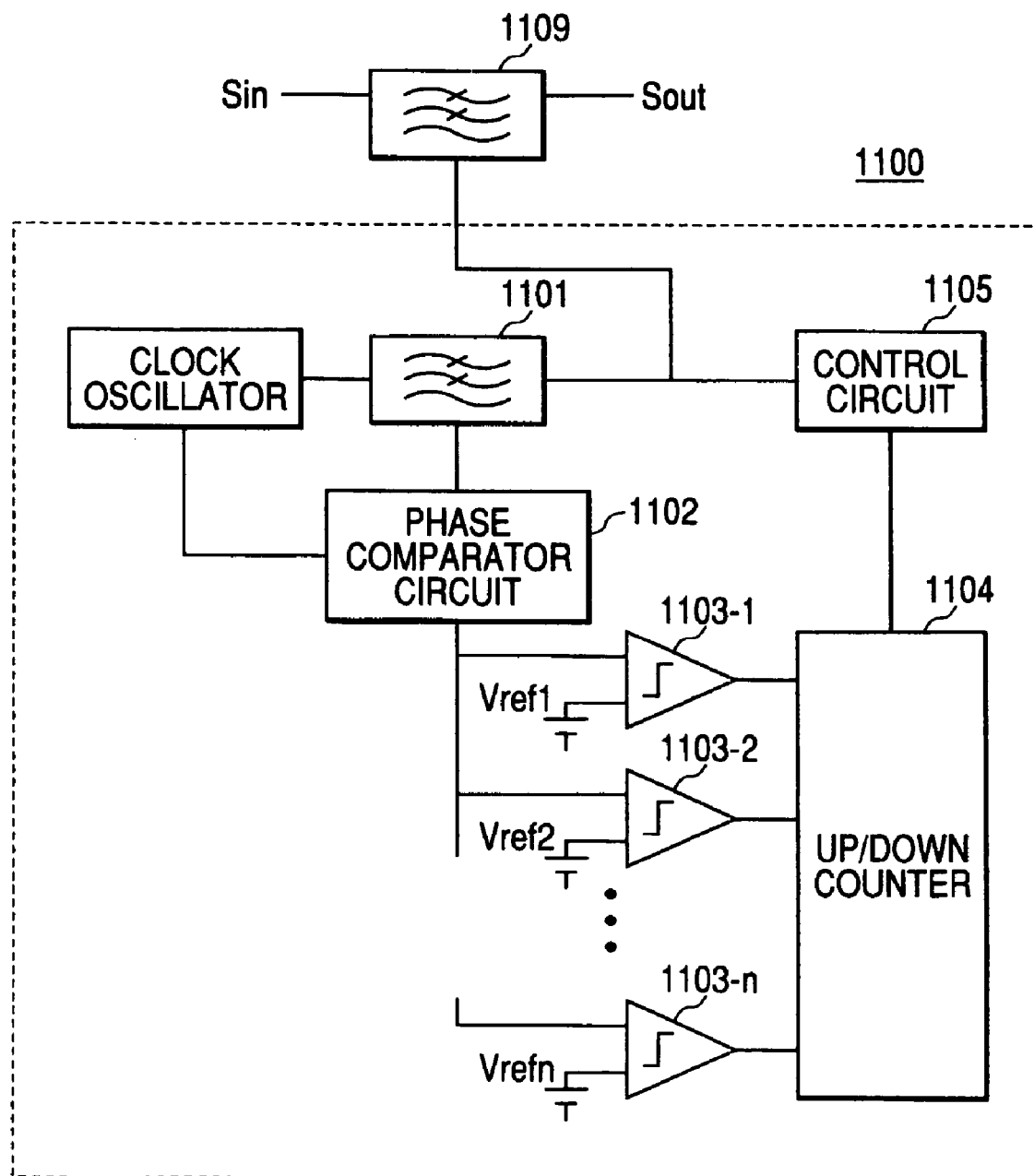
FIG. 11 is a block diagram illustrating a filter circuit attached to a time constant automatic adjusting circuit according to an eleventh embodiment of the invention.

FIG. 11 is a block diagram illustrating a filter circuit that has a time constant automatic adjusting circuit 1100 according to an eleventh embodiment of the invention and a filter circuit 1109 whose time constant is controlled by the time constant automatic adjusting circuit 1100.

The time constant automatic adjusting circuit 1100 includes a filter circuit 1101 to which a clock signal is input, a phase comparison circuit 1102 that compares a phase of an output signal of the filter circuit 1101 with a phase of the clock signal, at least three comparators 1103-1, 1103-2, . . . , and 1103-n that use the output of the phase comparison circuit 1102 as input thereof, an up-down counter 1104 that uses the output of these comparators as input thereof, and a control circuit 1105 that controls a time constant of the filter circuit 1101 on the basis of the output of the up-down counter 1104.

By using a master slave structure in which the above-mentioned time constant automatic adjusting circuit is used as a master circuit and the actually used filter circuit 1109 is used as the slave circuit, it is possible to construct a filter circuit having small variation in the time constant. In this case, the master circuit and the slave circuit do not need to be the same, and the components for determining the time constants thereof may be constructed by combining the same kind of elements. The filter circuit constructed in this way can be used in a wireless terminal.

The filter circuit according to the present embodiment may be achieved without using the master slave structure illustrated in FIG. 11.

Figure 12:
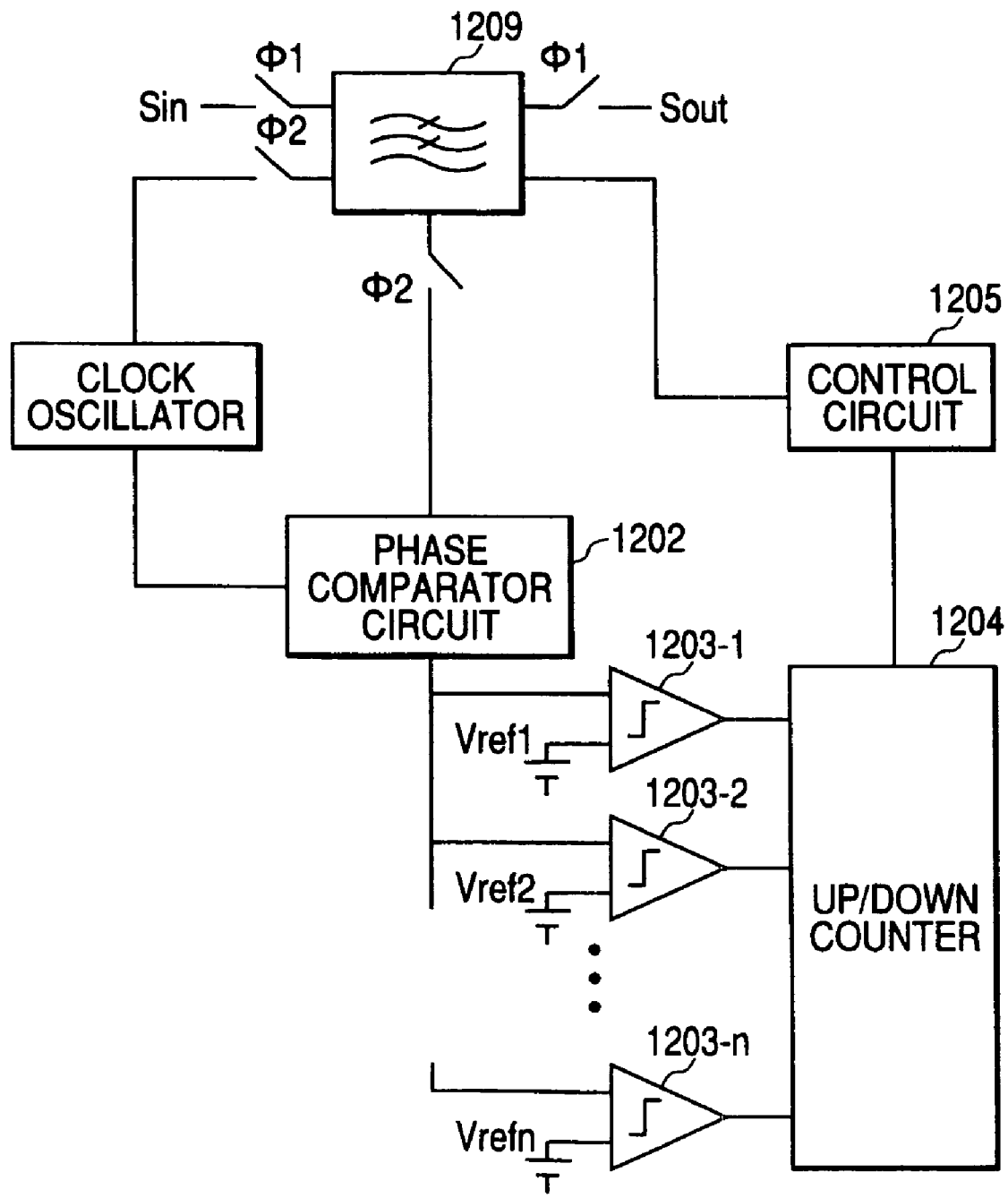
FIG. 12 is a block diagram illustrating a filter circuit attached to a time constant automatic adjusting circuit according to an eleventh embodiment of the invention.

FIG. 12 is a diagram illustrating an example where the master slave structure is not used, and a filter circuit whose time constant is automatically adjusted is separated from the automatic adjustment loop after the adjustment so as to be used as an actual filter circuit.

The filter circuit system 1200 includes a filter circuit 1201 to which an output signal of a clock oscillator 1206 is input, a phase comparison circuit 1202 that compares a phase of an output signal of the filter circuit 1201 with a phase of the clock signal, at least three comparators 1203-1, 1203-2, . . . , and 1203-n that use the output of the phase comparison circuit 1202 as input thereof, an up-down counter 1204 that uses the output of these comparators as input thereof, and a control circuit 1205 that controls a time constant of the filter circuit 1201 on the basis of the output of the up-down counter 1204. The filter circuit 1201 has switches φ1 and φ2 each of which switches connection between the filter circuit 1201 and another components. As a result, the filter circuit 1201 serves as a filter circuit for time constant adjustment and an original filter circuit. In the present embodiment, specifically, in the switches φ1, an input side of the filter circuit 1201 is connected to an external input line Sin of the filter circuit system 1200, and an output side of the filter circuit 1201 is connected to an external output line Sout of the filter circuit system 1200. That is, through the connection and disconnection of the switch φ1, the filter circuit 1201 and the external devices are connected or disconnected to each other. In addition, in the switches φ2, an input side of the filter circuit 1201 is connected to the clock oscillator 1206 of the filter circuit system 1200, and an output side of the filter circuit 1201 is connected to a phase comparison circuit 1202 of the filter circuit system 1200. That is, through the connection and disconnection of the switch φ2, the filter circuit 1201 is connected or disconnected to an automatic adjusting loop. In the present embodiment, during automatic adjustment, the switch φ2 is turned on, and when it is used as an actual filter circuit, the switch φ1 is turned on. Even in any cases, since the above-mentioned time constant automatic adjusting circuit is used, it is possible to achieve a filter circuit having short adjustment time.

Twelfth Embodiment

Figure 15:
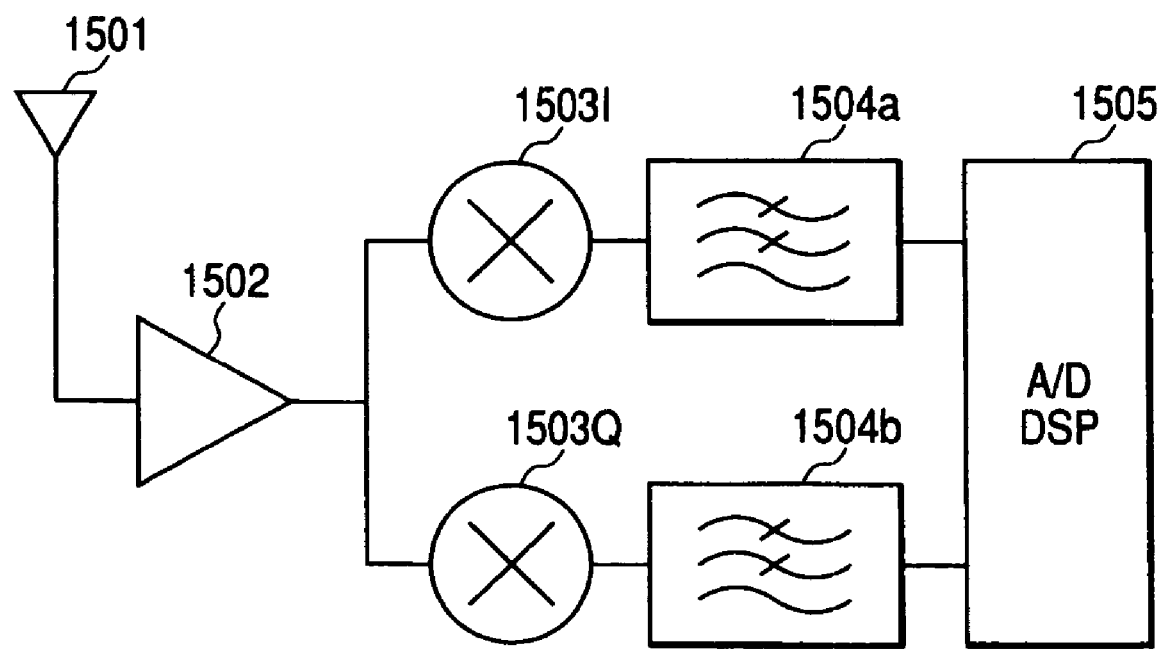
FIG. 15 is a diagram illustrating an example of a structure of a wireless communication terminal receiving unit according to a twelfth embodiment of the invention.

FIG. 15 is a block diagram illustrating a case in which a filter circuit using a time constant automatic adjusting circuit according to a twelfth embodiment of the invention is used in a receiving unit of a wireless communication terminal. In the present embodiment, the receiving unit 1500 of the wireless communication terminal includes an antenna 1501, a low-noise amplifier 1502, orthogonal demodulators 1503I and 1503Q, filter circuits 1504a and 1504b, and an A/D DSP 1505.

The filter circuit shown in FIG. 11 or 12 is used as the filter circuits 1504a and 1504b, which results in constructing a receiving unit of a wireless communication terminal.

The filter circuit using the time constant automatic adjusting circuit according to the present embodiment is used as each of the filter circuits 1504a and 1504b of the wireless communication terminal, which results in achieving a wireless communication terminal having short adjusting time when the time constant automatic adjustment of the filter circuit is performed. In addition to this embodiment, the filter circuit using the time constant automatic adjusting circuit according to the present embodiment can be used in a transmitter or a receiver (transmitter) for performing frequency conversion many times, that is, various applications can be made.

According to the above-mentioned embodiments, a time constant automatic adjusting circuit, a filter circuit system using the time constant automatic adjusting circuit, or the like can be achieved so as to achieve an integrated circuit having short adjustment time when the time constant automatic adjustment of the filter circuit is performed.

What is claimed is:

1. A time constant automatic adjusting circuit for adjusting a time constant of a filter circuit to which clock signal is input and which outputs filtered signal, the time constant is variable, comprising:
    a phase comparison circuit configured to generate output voltage according to a result of comparing a phase of a filtered signal with the phase of the clock signal;
    a first comparator configured to compare the output voltage with a first predetermined voltage;
    a second comparator configured to compare the output voltage with a second predetermined voltage, the second predetermined voltage is bigger than the first predetermined voltage;
    a third comparator configured to compare the output voltage with a third predetermined voltage, the third predetermined voltage is bigger than the second predetermined voltage;
    an up-down counter configured to generate counted bit signal according to the result of the first comparator, the second comparator, and the third comparator; and
    a control circuit configured to adjust the time constant of the filter circuit in accordance with the counted bit signal;
    wherein, the up-down counter adds first value to the counted bit signal when the output voltage is bigger than the first predetermined voltage,
    the up-down counter adds second value which is smaller than the first value to the counted bit signal when the output voltage is between the first predetermined voltage and the second predetermined voltage, and
    the up-down counter subtracts third value from the counted bit signal when the output voltage is smaller than the third predetermined voltage.

2. The time constant automatic adjusting circuit according to claim 1, wherein the up-down counter adds nothing to the counted bit signal when the output voltage is between the second predetermined voltage and the third predetermined voltage.

3. The time constant automatic adjusting circuit according to claim 2 further comprising:
    a number counting circuit configured to count a number of times when the output voltage is between the second predetermined voltage and the third predetermined voltage, and
    wherein the control circuit stops to adjust the time constant of the filter circuit when the number counting circuit counts a predetermined value.

4. The time constant automatic adjusting circuit according to claim 2 further comprising:
    a number counting circuit configured to count a number of times when the output voltage is between the second predetermined voltage and the third predetermined voltage, and
    wherein the phase comparison circuit stops to generate the output voltage when the number counting circuit counts a predetermined value.

5. The time constant automatic adjusting circuit according to claim 2 further comprising:
    a number counting circuit configured to count a number of times when the output voltage is between the second predetermined voltage and the third predetermined voltage, and
    wherein the first comparator, the second comparator, and the third comparator fixes its output when the number counting circuit counts a predetermined value.

6. The time constant automatic adjusting circuit according to claim 2 further comprising:
    a number counting circuit configured to count a number of times when the output voltage is between the second predetermined voltage and the third predetermined voltage, and
    wherein the up-down counter fixes the counted bit signal when the number counting circuit counts a predetermined value.

7. The time constant automatic adjusting circuit according to claim 1, further comprising:
    a frequency variable clock circuit configured to provide an operation clock signal to the up-down counter, and
    wherein the frequency variable clock circuit provides first operation clock signal to the up-down counter when the output voltage is bigger than the first predetermined voltage, and provides second operation clock signal to the up-down counter when the output voltage is between the first predetermined voltage and the second predetermined voltage, and
    the up-down counter operates according to the timing which is represented by the operation clock.

8. The time constant automatic adjusting circuit according to claim 1,
    wherein the first predetermined voltage, the second predetermined voltage, and the third predetermined voltage are variable.

9. The time constant automatic adjusting circuit according to claim 1,
    wherein a variation of the time constant corresponding to the counted bit signal is variable.

10. The time constant automatic adjusting circuit according to claim 1, further comprising:
    an adder-subtractor configured to add a predetermined value to the value of the counted bit signal, and configured to subtract the predetermined value from the counted bit signal.

11. The time constant automatic adjusting circuit according to claim 1, further comprising:
    a bit initialization circuit configured to set a value represented by the counted bit signal to a predetermined value.

12. The time constant automatic adjusting circuit according to claim 1, further comprising:
    an initial voltage setting unit configured to set the output voltage to a predetermined value.

13. A filter circuit system comprising:
a filter circuit having a time constant that is controlled by the time constant automatic adjusting circuit according to claim 1.

14. A time constant automatic adjusting circuit for adjusting a time constant of a filter circuit to which clock signal is input and which outputs filtered signal, the time constant is variable, comprising:
- a phase comparison circuit configured to generate output voltage according to a result of comparing a phase of a filtered signal with the phase of the clock signal;
- a first comparator configured to compare the output voltage with a first predetermined voltage;
- a second comparator configured to compare the output voltage with a second predetermined voltage, the second predetermined voltage is bigger than the first predetermined voltage;
- a third comparator configured to compare the output voltage with a third predetermined voltage, the third predetermined voltage is bigger than the second predetermined voltage;
- an up-down counter configured to generate counted bit signal according to the result of the first comparator, the second comparator, and the third comparator; and
- a control circuit configured to adjust the time constant of the filter circuit in accordance with the counted bit signal;

wherein, the up-down counter adds first value to the counted bit signal when the output voltage is bigger than the first predetermined voltage, the up-down counter subtracts second value when the output voltage is between the first predetermined voltage and the second predetermined voltage, and the up-down counter subtracts third value which is bigger than the second value from the counted bit signal when the output voltage is smaller than the third predetermined voltage.

* * * * *